US005758852A

United States Patent [19]

Martin

[11] Patent Number: 5,758,852

[45] Date of Patent: Jun. 2, 1998

[54] MODULAR LOUDSPEAKER ENCLOSURE SUSPENSION RIGGING SYSTEM

[76] Inventor: Andrew Terry Martin, ATM Group Attn: Andrew Martin, 20960 Brant Ave., Carson, Calif. 90810-1040

[21] Appl. No.: 243,718

[22] Filed: May 17, 1994

[51] Int. Cl.[6] .................. H05K 5/00; A47F 5/08

[52] U.S. Cl. .................. 248/282.1; 248/323; 52/27; 52/39; 403/55; 403/328; 403/234; 381/188; 181/199; 312/246; 312/351.1

[58] Field of Search .................. 312/245, 101, 312/198, 323, 246, 248, 201, 351.1; 52/27, 39, 36.4; 403/59, 53, 324, 328, 234, 235, 268, 57, 58; 362/147; 248/323, 309.1, 298, 317, 282.1; 381/188, 205, 87, 88, 90; 181/150, 199, 148

[56] References Cited

U.S. PATENT DOCUMENTS

| | | | |
|---|---|---|---|
| 943,174 | 12/1909 | Beard | 248/323 |
| 3,319,280 | 5/1967 | Trachsler | 403/58 X |
| 3,782,065 | 1/1974 | Griffing | 52/39 |
| 3,911,221 | 10/1975 | Wong | 381/188 |
| 3,964,612 | 6/1976 | Skilliter, Jr. et al. | 248/309.1 X |
| 4,014,597 | 3/1977 | Griffin, Jr. | 312/258 X |
| 4,179,008 | 12/1979 | LeTourneau | 181/148 X |
| 4,190,738 | 2/1980 | Samuels | 312/351.1 X |
| 4,272,972 | 6/1981 | James | 403/58 X |
| 4,651,963 | 3/1987 | Busse et al. | 248/323 |
| 4,660,728 | 4/1987 | Martin | 248/323 X |
| 4,673,057 | 6/1987 | Glassco | 181/199 X |
| 4,757,544 | 7/1988 | Guy | 381/205 X |
| 4,805,730 | 2/1989 | O'Neill et al. | 312/111 X |
| 4,979,785 | 12/1990 | Richards | 312/246 X |
| 5,139,223 | 8/1992 | Sedighzadeh | 52/39 X |
| 5,258,584 | 11/1993 | Hubbard | 181/199 X |
| 5,266,751 | 11/1993 | Taguchi | 181/148 X |
| 5,360,192 | 11/1994 | Pittella | 248/298 X |
| 5,368,270 | 11/1994 | Wiwczar | 248/317 X |

FOREIGN PATENT DOCUMENTS

| | | | |
|---|---|---|---|
| 567115 | 5/1958 | Belgium | 403/102 |
| 195446 | 9/1986 | European Pat. Off. | 312/245 |
| 4115659 | 11/1992 | Germany | 248/323 |

OTHER PUBLICATIONS

Brochure: ATM Fly–Ware AMFS–1X2 Series Modular Loudspeaker Flying System 1992.

*Primary Examiner*—Peter M. Cuomo
*Assistant Examiner*—Janet M. Wilkens
*Attorney, Agent, or Firm*—Fulwider Patton Lee & Utecht, LLP

[57] ABSTRACT

A loudspeaker suspension system for suspending a plurality of individual loudspeakers from an overhead support in spaced apart relationship for adjustment to different related positions and orientations relative to one another to selectively focus the acoustic throw of the loudspeakers. The system includes a plurality of frame members mounted to the respective loudspeakers and a plurality of connectors for connection between respective adjacent pairs of frame members. The connectors include a pair of elongated oppositely disposed connecting arms for connection from their respective distal ends with the respective loudspeakers and further include a pivot joint connecting the medial ends of the connector arms together so that the respective connecting arms may be pivoted to angle the respective adjacent pair of loudspeakers relative to one another.

17 Claims, 9 Drawing Sheets

FIG. 1
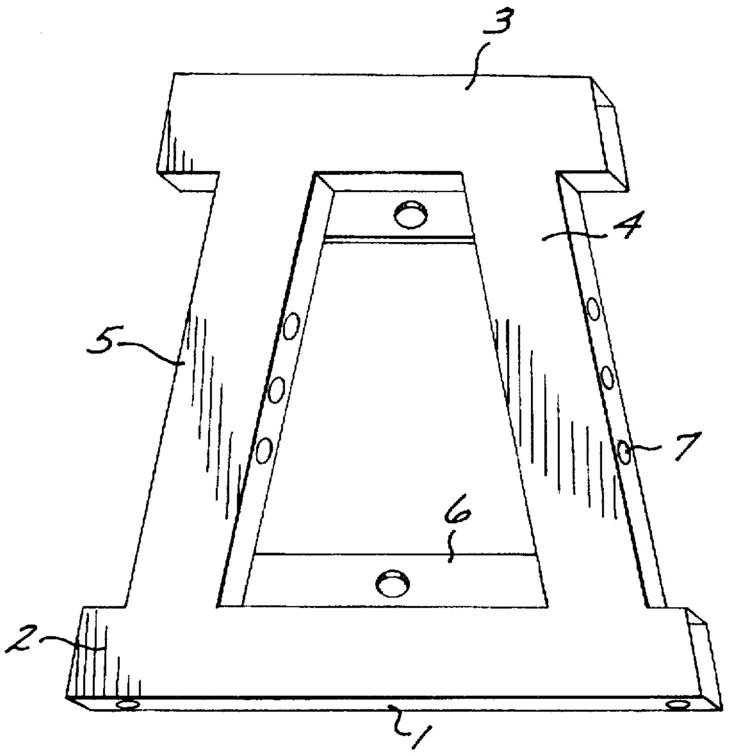
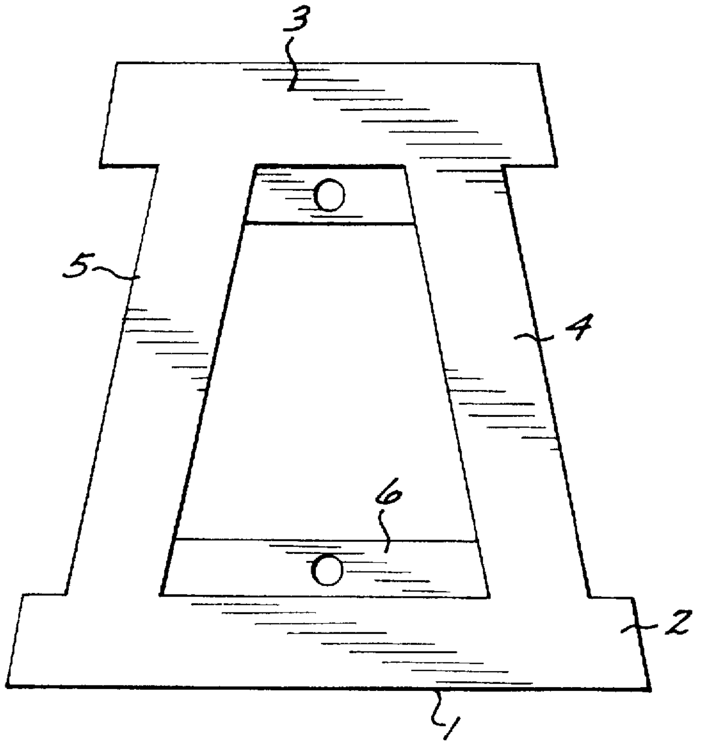
FIG. 2
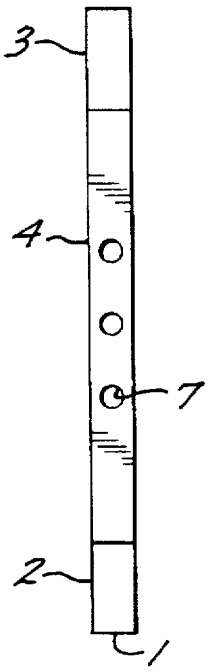
FIG. 3

FIG. 22
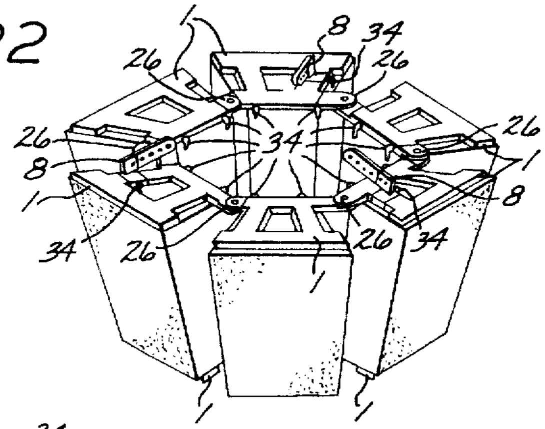
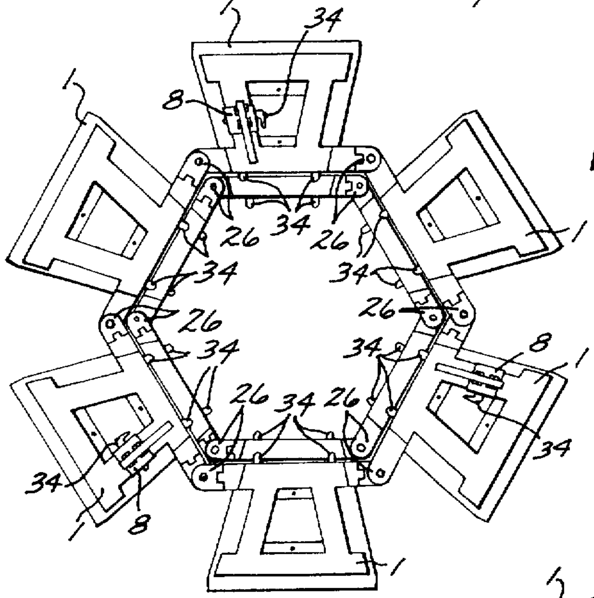
FIG. 23
FIG. 24
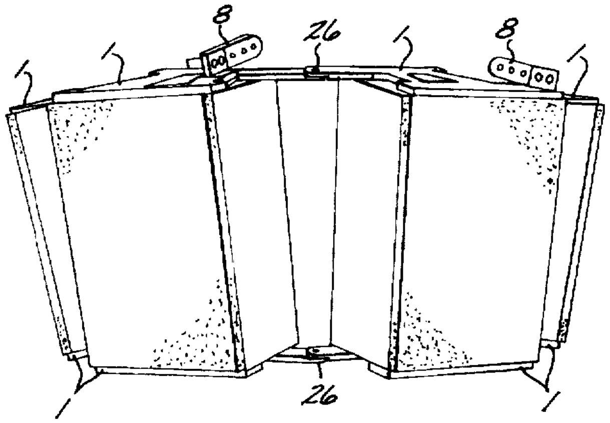

FIG. 25
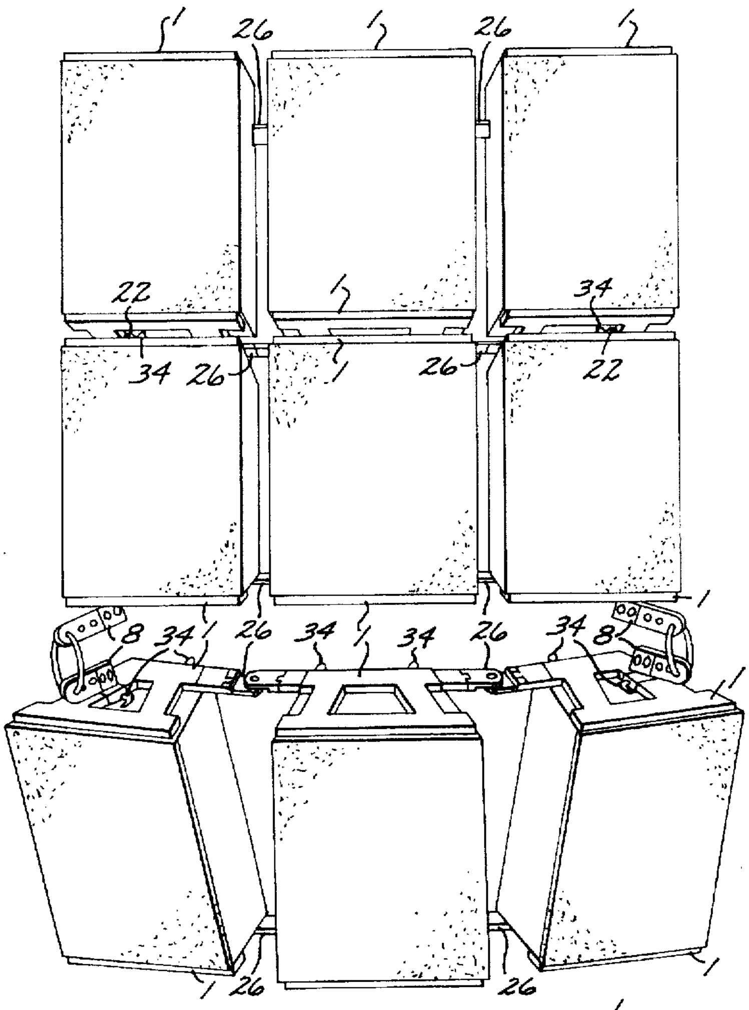
FIG. 27
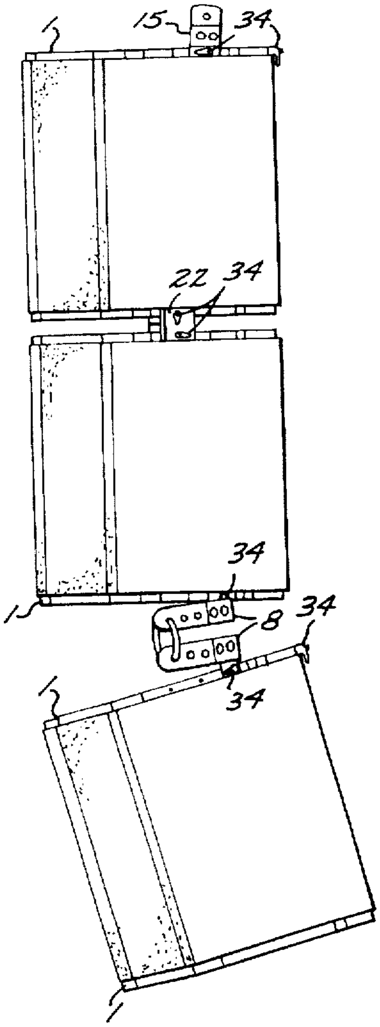
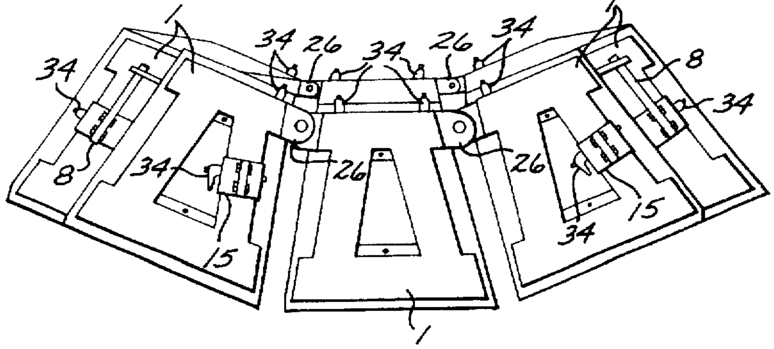
FIG. 26

MODULAR LOUDSPEAKER ENCLOSURE SUSPENSION RIGGING SYSTEM

BACKGROUND OF THE INVENTION

1. Field of the Invention

The present invention provides a structural member (truss module) which, when attached to a loudspeaker enclosure, renders that loudspeaker enclosure suspendable. The same structural members (truss modules), when attached to numerous loudspeaker enclosures, render the group of loudspeaker enclosures suspendable as a whole unit from a minimized number of suspension points when various other members included in the present invention are utilized in conjunction with the truss modules. Moreover, the present invention allows for angle variance between adjacent loudspeaker enclosures by utilizing multiple adjustable structural components (connecting bars) between adjacent loudspeaker enclosures. The aforementioned connecting bars can be adjusted for proper loudspeaker enclosure aim and then tightened into a rigid connection between adjacent loudspeaker enclosures, thereby rendering the loudspeaker enclosure group a solid mass. The present invention allows for the suspension of the loudspeaker group by a minimal number of suspension points with the utilization of structural mounts (shackle mounts, extended shackle mounts, stacking brackets) connected onto the truss modules. The present invention provides for the expedient assembly and disassembly of all component parts with the use of structural retaining pins (quick release pins) and/or bolt and nut fasteners.

2. Description of the Prior Art

There are no known modular loudspeaker enclosure suspension rigging systems disclosed in the prior art.

SUMMARY OF THE PRESENT INVENTION

The present invention provides a loudspeaker rigging system that is compact, modular, and rigid in nature, yet maintains spatial alignment. The present invention also takes into account the optimal array configurations for the loudspeakers being utilized while maintaining adequate structural integrity throughout the rigging hardware system. To illustrate:

Compact and Modular Design:

It is important for a loudspeaker enclosure suspension rigging system to be compact and modular. The compact characteristic makes for an unobtrusive suspension rigging system that benefits the loudspeaker handlers as well as the aesthetics of the loudspeaker array. For this reason, an alternative to an overall top hanging truss was developed: and to make it easier on the handlers, the present invention loudspeaker enclosure suspension rigging system is modular and can be fixed to the loudspeaker so that it does not have to be removed for transportation from job to job. The modularity of the present invention loudspeaker enclosure suspension rigging system also enables the user to attach as many loudspeakers as are necessary without an assortment of cumbersome top suspension truss variations.

The present invention loudspeaker enclosure suspension rigging system holds great advantages over other types of suspension systems for portable, semi-temporary, or permanent applications. For the portable and semi-temporary uses, a modular system will save time and manpower while giving the sound system designer freedom to predictably configure the loudspeaker cluster in many different ways. The benefits of this freedom are clear when one considers the average touring sound company and the many different types of venues encountered. Other advantages present themselves when considering the total weight of the loudspeaker array, and applications in which limited space is available for loudspeaker array suspension.

With the present invention loudspeaker enclosure suspension rigging system, the sound designer is able to configure the loudspeaker cluster in "long-throw" formats for deep venues, or "short-throw" formats for shallow venues. A combination of "long-throw" and "short-throw" formats can also be configured with the present invention. Independent arch loudspeaker arrays can be constructed with case, thereby presenting the user with a flexibility previously unknown in a loudspeaker enclosure suspension system. The loudspeaker enclosure suspension rigging system is designed with redundancy which enables the loudspeaker to be configured in the upright position or inverted, and to attach together in the same manner regardless. And, since the present invention loudspeaker enclosure suspension rigging system is designed to construct rigid loudspeaker arrays when assembled properly, the loudspeaker array can be treated as an individual unit rather than a multitude of smaller units.

For permanent applications, the sound contractor is able to construct a clean looking and compact loudspeaker array without spending an excessive amount of money to have customized suspension trusses fabricated. The contractor also has the peace of mind that the loudspeaker enclosure suspension rigging system is safe and will affix the loudspeakers in their intended alignment without the danger of being moved around after the contractor has completed the installation.

Rigid Array Design:

The present invention loudspeaker enclosure suspension rigging system has the capacity to lock rigidly into position when the loudspeaker array is constructed. A rigid loudspeaker array will have much more inertia than a non rigid array, and therefore not be as susceptible to swinging and settling. Also, the loudspeakers are easily configured into identical array formations time after time due to the rigid nature of the attachment parts.

The rigid array is easier to suspend in the air: usually from fewer suspension points than conventional loudspeaker suspension methods. Also, the array output characteristics will be uniform and familiar to the sound designer time after time.

Another advantage to the present invention loudspeaker enclosure suspension rigging system is found when considering the coupling effects of the loudspeaker components to the loudspeaker array. A rigid array will act as a more desirable sound board for the loudspeakers and cause fewer reflective distortions. The reflective distortions that are present will be uniform and consistent, once again giving more control and predictability to the sound designer.

Spatially Aligned Design:

Loudspeaker array design theory states that a loudspeaker enclosure suspension rigging system should not displace the acoustic wavefront alignment of the loudspeakers in relation to one another. If this alignment is not maintained, comb filtering will increase dramatically and the output of the loudspeaker array will cancel at certain frequencies and add at others. This comb filtering causes lobing and reduces intelligibility of the loudspeaker system as a whole.

The present invention loudspeaker enclosure suspension rigging system does not displace the acoustic wavefront alignment of the loudspeakers. Once more, the present invention actually disallows the use of loudspeakers in a non-coherent wavefront array environment along the horizontal axis with the use of rigid connecting attachments. In the vertical axis, the present invention loudspeaker enclosure suspension rigging system can be adjusted to maintain a coherent wavefront alignment regardless of tilt angle.

Loudspeaker array design theory also states that the acoustic centers of the loudspeakers in the array should not be displaced from a designated point-source in space. As with the acoustic wavefront, the misalignment of acoustic centers will cause dramatically increased comb filtering. It can be difficult to align acoustic centers since they are usually located within the loudspeaker itself This unavoidable characteristic of loudspeakers makes it very difficult to align the acoustic centers of multiple loudspeakers to a point source in space. Therefore, a compromise has been designed into the present invention loudspeaker enclosure suspension rigging system that will maintain the acoustic wavefront alignment, and at the same time array the loudspeakers so that they perform optimally in relation to each other in both the vertical and horizontal planes. As a result, the present invention loudspeaker enclosure suspension rigging system will actually improve the performance of the loudspeaker array when compared to most presently available methods of suspending loudspeaker systems.

Structural Integrity:

The structural integrity of any type of suspension rigging system is extremely important. The present invention loudspeaker suspension rigging system is designed with a minimum of a 5:1 design factor.

Most of the components of the present invention loudspeaker enclosure suspension rigging system are constructed of high grade structural steel rather than softer alloys for added bend and impact resistance. The structural steel also allows the parts to be more compact and to be easily repainted should the finish get damaged.

Application:

The compact and modular aspects of the present invention loudspeaker enclosure suspension rigging system is approached with an emphasis on aesthetics and redundancy. The present invention loudspeaker enclosure suspension rigging system is designed in sectional pieces, as if a top mounted flat truss was cut into individual sections; each one being large enough to support one loud speaker. Each loudspeaker truss section (hereafter referred to as a Truss Module) is manufactured with low profile high grade structural steel tube.

The Truss Modules are strong enough so that an overall top truss (grid truss) is not necessary: rather, the Truss Module itself acts as the grid truss. Each Truss Module is fastened to the loudspeaker on the top and on the bottom of the loudspeaker in such a way that the loudspeaker is structurally sound.

The Truss Modules are low profile enabling them to be affixed to the loudspeaker permanently (or temporarily as they are removable) and not cause problems for transportation or handling. In most cases, the Truss Module is designed to attach to the loudspeaker's existing attachment hardware.

The Truss Modules are redundant; the top Truss Module is identical to the bottom Truss Module, and a Truss Module on any other alike loudspeaker is also identical. Truss Modules will vary with the loudspeaker for which they are designed since the Truss Module must accommodate the footprint of the loudspeaker it supports.

The tubular Truss Module steel enables the Truss Modules to be locked together in the horizontal plane utilizing an attachment that slips into the end of the tube; thereby leaving a smooth and flat surface on the top and bottom of the loudspeaker for stacking additional loudspeakers on top.

This attachment (hereafter referred to as a Connecting Bar) is held in place with the use of a quick release retaining pin (Quick Release Pin).

The Quick Release Pin quickly and easily passes through the face surface of the Truss Module steel tube, through the Connecting Bar, and then through the back of the Truss Module steel tube. Two Connecting Bars are used per pair of loudspeakers. The design is such that the structural stress on each Quick Release Pin is predominantly shear stress, and the pin does not have a tendency to bend or flex.

The Connecting Bars are designed to maintain the optimum performance from the loudspeaker array in the horizontal plane with regard to comb filtering and lobing effects. The Connecting Bar angle is continuously variable so that the splay angle between adjacent loudspeakers can be varied and array directivity can be concentrated or broadened.

Connecting Bars are usually placed in the rear of the loudspeaker Truss Module at both the top and the bottom Truss Module junctions. The Connecting Bars can be installed in the front of the loudspeaker Truss Module so long as both the top and the bottom junctions are installed. The dual Connecting Bar placement channels most of the hanging force into shear stress rather than torsion.

Rows of loudspeakers are suspended with the use of Shackle Mounts, Stacking Brackets, or Supporting Shackle Mounts.

A Shackle Mount can be attached to the Truss Module at one of many positions and is held in place with Quick Release Pins. By changing the position of the Shackle Mount on the Truss Module, the loudspeaker row can be tilted at various angles.

The Shackle Mount Extended not only provides an attachment point, but also enables additional tilt by moving the shackle attachment point on the Shackle Mount itself.

Multiple rows of loudspeakers may be constructed with the attachment of Shackle Mounts and/or Shackle Mount Extendeds to the bottom Truss Module of the top row of the loudspeaker array and to the top Truss Module of the bottom row of the loudspeaker array, etc., etc. The lower rows of loudspeakers in multiple row arrays can be moved backward for a coherent acoustic wavefront by positioning the upper Shackle Mount toward the rear of the Truss Module.

Multiple rows of loudspeakers may also be constructed using Stacking Brackets. The Stacking Brackets configure rows of loudspeakers vertically without any tilt. The Stacking Bracket is often used for long-throw loudspeaker arrays.

DESCRIPTION OF THE DRAWINGS

For a better understanding of the invention as well as other objects and further features thereof, reference is made to the following description which is to be read in conjunction with the accompanying drawing wherein:

FIG. 1 is a perspective view of a representative truss module component of the present invention, keeping in mind that truss module dimension and design will vary with the loudspeaker enclosure type;

FIG. 2 is a top plan view of the truss module shown in FIG. 1;

FIG. 3 is a side elevational view of the truss module shown in FIG. 1;

FIG. 22 is a front elevational view of another representative loudspeaker grouping being suspended with the present invention, keeping in mind that the number of loudspeaker enclosures is variable, and the angle between adjacent loudspeaker enclosures is variable;

FIG. 23 is a top plan view of the loudspeaker grouping shown in FIG. 22;

FIG. 24 is a side elevational view of the loudspeaker grouping shown in FIG. 22;

FIG. 25 is a front elevational view of a representative multi-tiered loudspeaker grouping being suspended with the present invention, keeping in mind that the number of loudspeaker enclosures is variable, and the angle between adjacent loudspeaker enclosures is variable;

FIG. 26 is a top plan view of the loudspeaker grouping shown in FIG. 25;

FIG. 27 is a side elevational view of the loudspeaker grouping shown in FIG. 25.

DESCRIPTION OF THE PRESENT INVENTION

Figure 4:
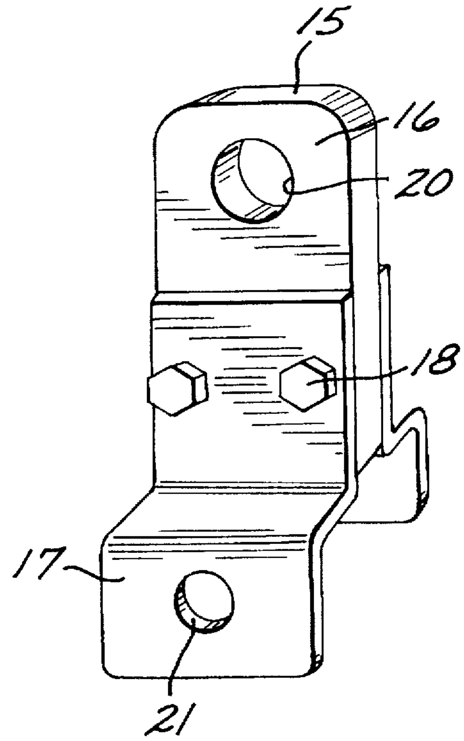
FIG. 4 is a perspective view of the shackle mount component of the present invention, keeping in mind that mount dimension and design will vary according to the dimension of the truss module.

Referring now to FIGS. 1–3, a frame or truss module device 1 comprises two tubular assemblies, one positioned in the front of the device 2 and one positioned in the back of the device 3. Two additional tubular assemblies 4, 5 are positioned lengthwise between 2, 3 thereby completing a framework for the truss module device. Plates 6 are added to the device for stiffening and mounting. Parts 2, 3, 4, 5, 6 are connected together by structural weldment. Various holes 7 are positioned throughout tubular assemblies 2, 3, 4, 5 to accommodate attachment of various mounts described in the present invention at several locations. FIG. 3 shows the open end of tubular assemblies 2, 3 where a connector or a connecting bar device may be inserted into the truss module device.

Figure 5:
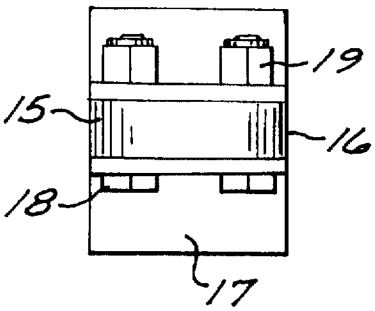
FIG. 5 is a top plan view of the shackle mount shown in FIG. 4.
Figure 6:
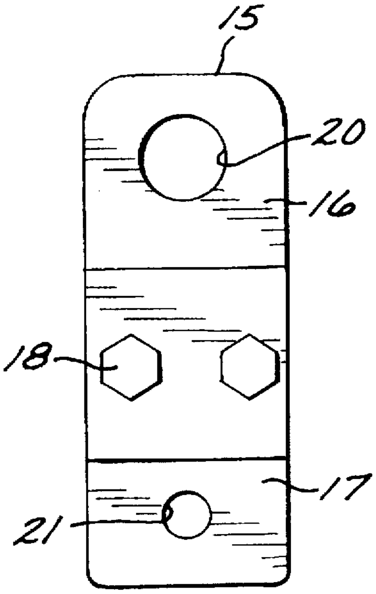
FIG. 6 is a side elevational view of the shackle mount shown in FIG. 4.

Referring now to FIGS. 4–6, shackle mount device 15 comprises two identically formed assemblies, 17, one positioned front and one positioned back, the back part positioned 180 degrees from the front part. An extension 16 is fastened between the two formed parts 17 with SAE grade 8 bolt type fasteners 18 and SAE grade 8 nylon insert locking nuts 19. The formed parts 17 contain high tolerance holes 21 which serve as the attachment point to the truss module devices described in the present invention. The extension part 16 includes one large diameter hole 20 which serves as the suspension attachment point for the present invention.

Figure 7:
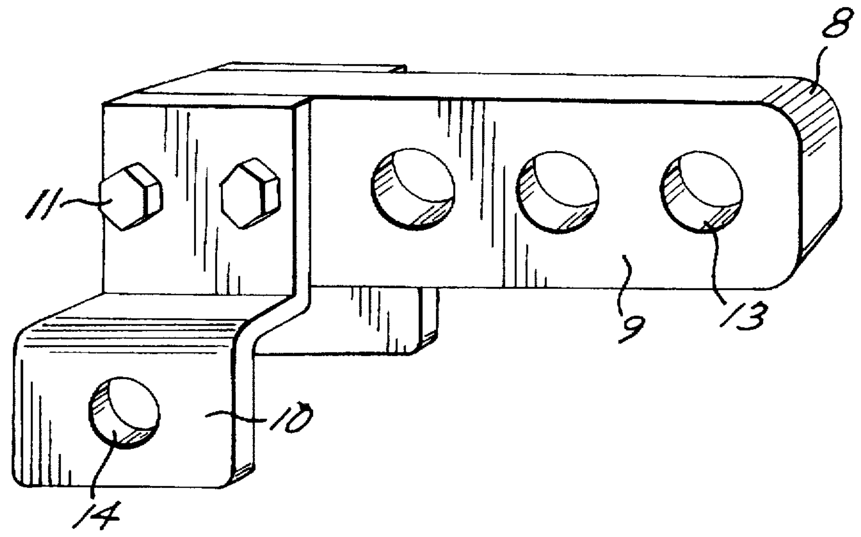
FIG. 7 is a perspective view of the extended shackle mount component of the present invention, keeping in mind that mount dimension and design will vary according to the dimension of the truss module.
Figure 8:
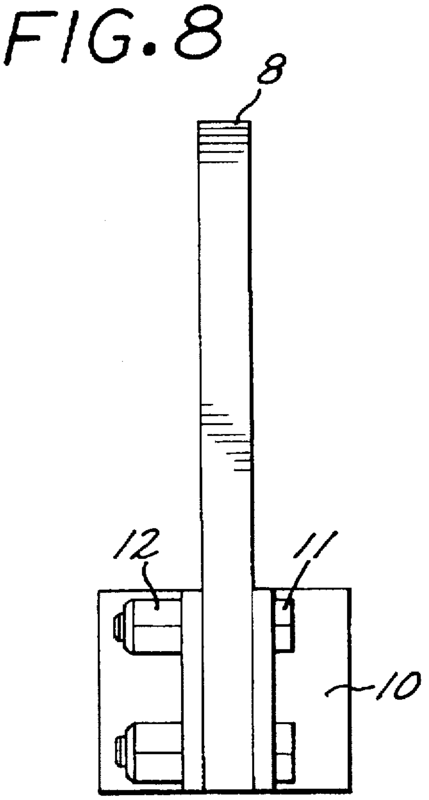
FIG. 8 is a top plan view of the extended shackle mount shown in FIG. 7.
Figure 9:
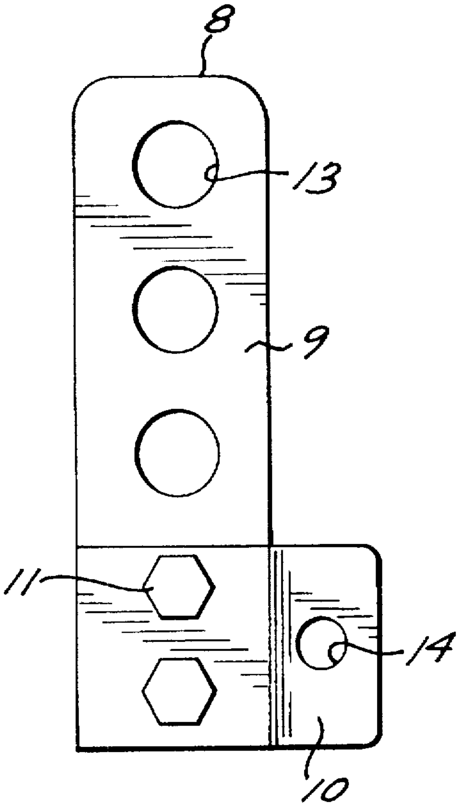
FIG. 9 is a side elevational view of the extended shackle mount shown in FIG. 7.

Referring now to FIGS. 7–9, extended shackle mount device 8 comprises two identically formed assemblies 10, one positioned front and one positioned back, the back part positioned 180 degrees from the front part. An extension 9 is fastened between the two formed parts 10 with SAE grade 8 bolt type fasteners 11 and SAE grade 8 nylon insert locking nuts 12. The formed parts 10 contain high tolerance holes 14 which serve as the attachment point to the truss module devices described in the present invention. The extension part 9 includes several large diameter holes 13 which serve as the suspension attachment point for the present invention.

Figure 10:
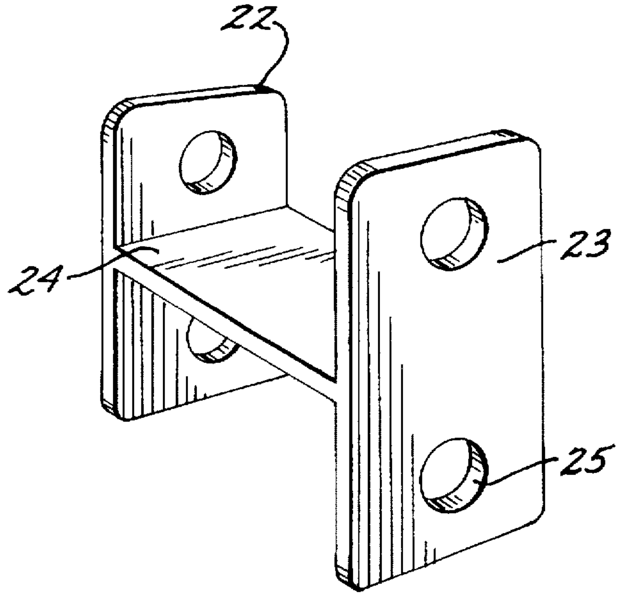
FIG. 10 is a perspective view of the stacking bracket mount component of the present invention, keeping in mind that mount dimension and design will vary according to the dimension of the truss module.
Figure 11:
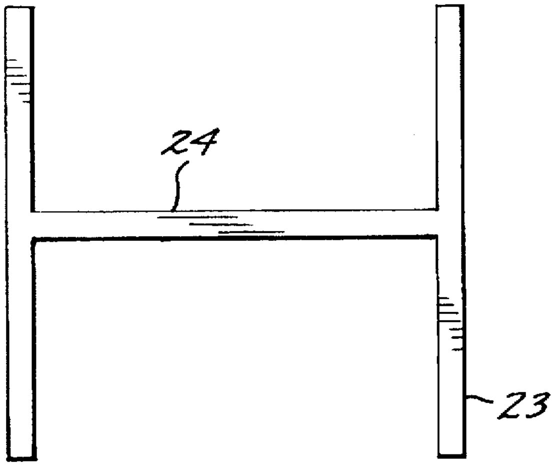
FIG. 11 is a top plan view of the stacking bracket mount shown in FIG. 10.
Figure 12:
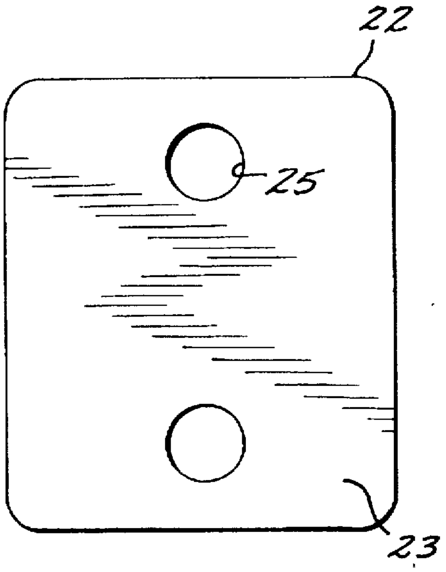
FIG. 12 is a side elevational view of the stacking bracket mount shown in FIG. 10.

Referring now to FIGS. 10–12, stacking bracket device 22 comprises two identically shaped assemblies 23, one positioned on either side of a perpendicularly positioned plate 24 and are connected together by structural weldment. Assemblies 23 contain high tolerance holes 25 which serve as the attachment point to the truss module devices described in the present invention.

Figure 13:
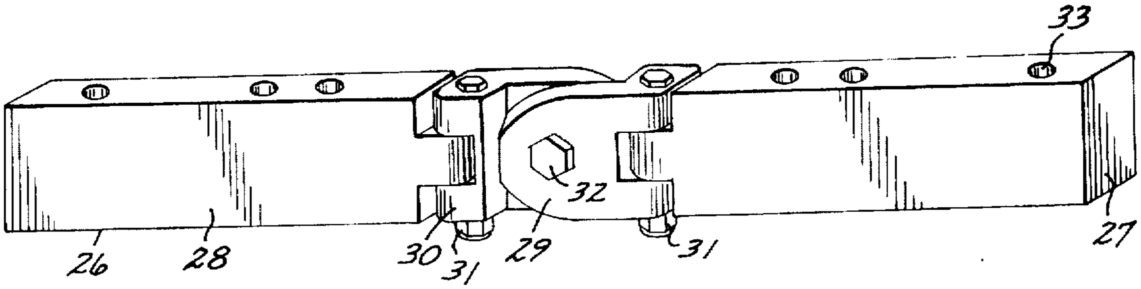
FIG. 13 is a perspective view of the connecting bar component of the present invention, keeping in mind that connecting bar dimension and design will vary according to the dimension of the truss module.
Figure 14:
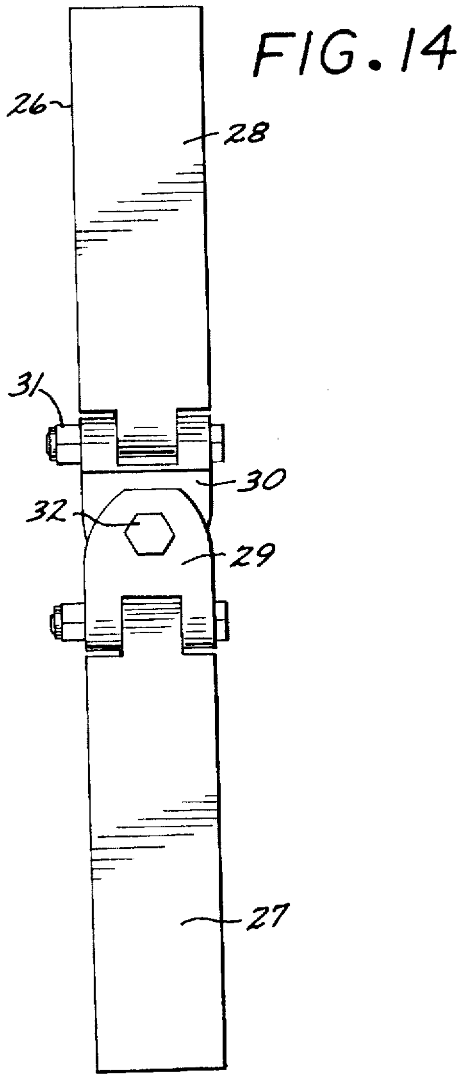
FIG. 14 is a top plan view of the connecting bar shown in FIG. 13.
Figure 15:
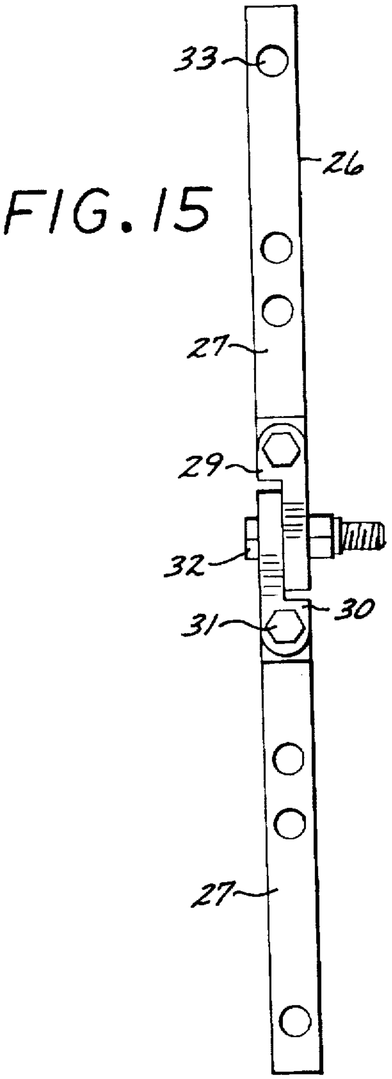
FIG. 15 is a side elevational view of the connecting bar shown in FIG. 13.

Referring now to FIGS. 13–15, connecting bar device 26 comprises two elongated connecting or extension arms 27, 28 pivoted together at a pivot joint including two identical swivel joint parts 29, 30 fastened together with SAE grade 8 bolt type fasteners and SAE grade 8 nylon insert locking nuts 31 through a male-female hinge intersection. Swivel joint part 29 is positioned opposing swivel joint part 30 and both 29, 30 are fastened together at a central pivot point with an SAE grade 8 bolt type fastener and SAE grade 8 nylon insert locking nut 32. Parts 27, 28, 29, 30 when fastened with bolts 31, 32 create a universal type joint able to flex in all directions and then be fixed into position by tightening bolts 31, 32. Parts 27, 28 contain several holes 33 which serve as selectable retention points when the part is inserted into the front and/or back tubular assemblies on the truss module device described in the present invention.

Figure 16:
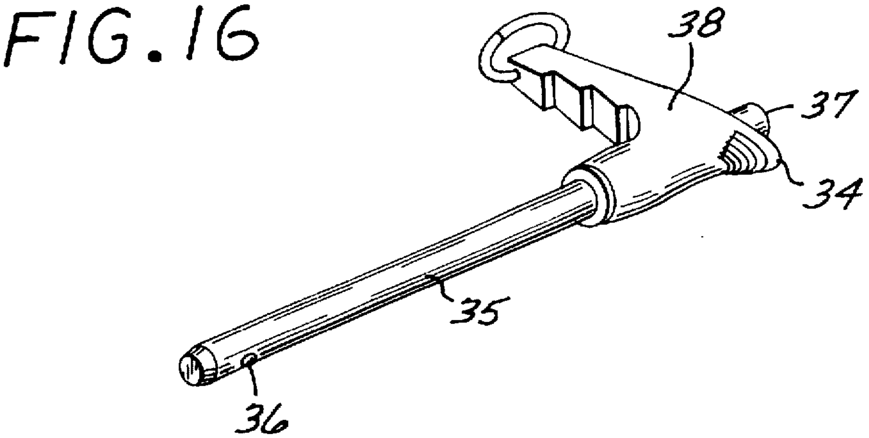
FIG. 16 is a perspective view of the quick release pin component of the present invention, keeping in mind that quick release pin dimension and design will vary according to the dimension of the mount and/or connecting bar.
Figure 18:
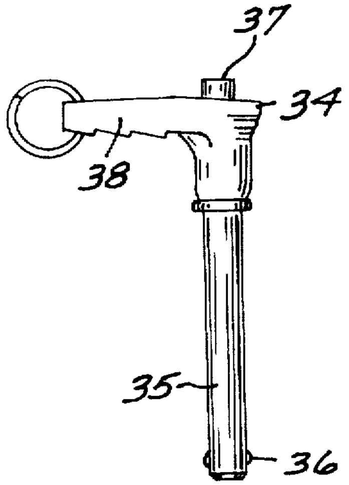
FIG. 18 is a side elevational view of the quick release pin shown in FIG. 16.
Figure 17:
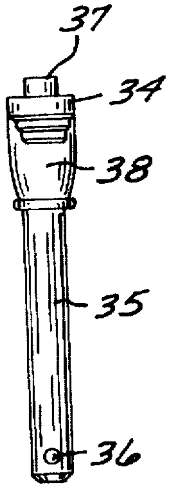
FIG. 17 is a top plan view of the quick release pin shown in FIG. 16.

Referring now to FIGS. 16–17, quick release pin device 34 comprises a cylindrical shaft 35 of a predetermined length which contains two retractable retaining balls 36 at a predetermined location toward the end of the shaft 35. A handle 38 is attached to the top end of the shaft 35 by conventional mechanical means for handling and serves as a stop for the shaft 35. The retaining balls 36 contained within the shaft 35 are spring loaded and will retract into the shaft 35 when a button 37 is depressed at the top of the handle 38. When the button 37 is released, the retaining balls 36 will move to protrude from the shaft 35 and cause the quick release pin to be locked in to the appropriate devices as described in the present invention.

Figure 19:
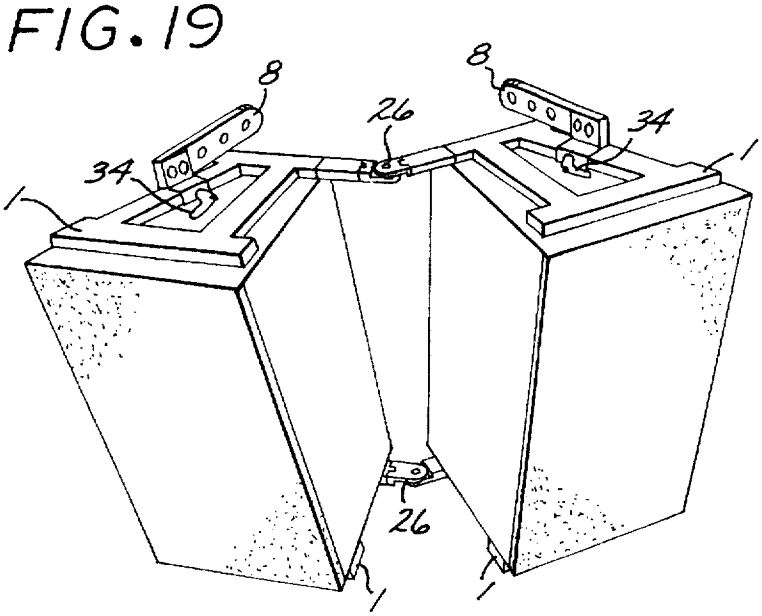
FIG. 19 is a front elevational view of a representative loudspeaker grouping being suspended with the present invention keeping in mind that the number of loudspeaker enclosures is variable, and the angle between adjacent loudspeaker enclosures is variable.
Figure 20:
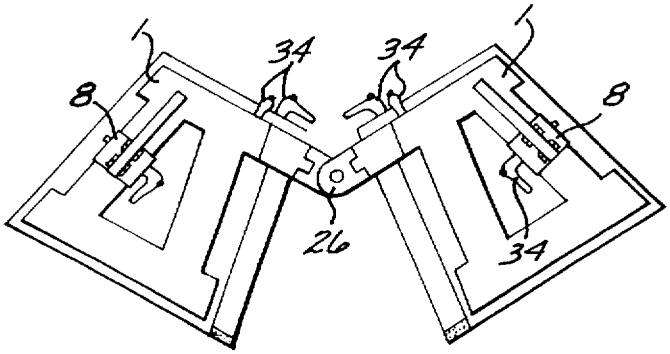
FIG. 20 is a top plan view of the loudspeaker grouping shown in FIG. 19.
Figure 21:
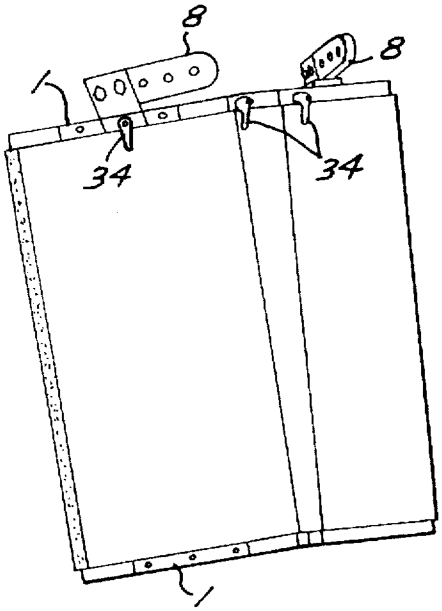
FIG. 21 is a side elevational view of the loudspeaker grouping shown in FIG. 19.

Referring now to FIGS. 19–21, representative of a two loudspeaker grouping of present invention comprises four truss modules 1 fastened to the loudspeakers with conventional mechanical means to the top and the bottom of each loudspeaker. Connecting bar devices 26 are inserted into the rear tubular assembly of the adjacent truss modules 1 at the top and the bottom of each loudspeaker, the bottom connecting bar 26 being held in place with quick release pins 34 at the selected inward-most position thereby positioning the loudspeakers close together at the bottom. The top connecting bar 26 being held in place with quick release pins 34 at the selected outward-most position thereby positioning the loudspeakers farther apart at the top. The connecting bar 26 is retained in the truss module 1 by passing a quick release pin 34 through one side of the truss module tubular assembly then through the inserted connecting bar then through the opposite side of the truss module tubular assembly. The universal joint mechanism built into the connecting bar 26 is adjusted to provide a splay (horizontal spreading) between the loudspeakers and then fastened securely by tightening the bolt fasteners located in the joint of the connecting bars 26. The loudspeakers, being in a fixed position, can then be suspended as a group utilizing two extended shackle mounts 8 fastened to the top truss modules 1 of each of the loudspeakers with the use of quick release pins 34. The extended shackle mounts 8 can be attached at any one of the selected holes included in the truss module 1 tubular assemblies. The extended shackle mount 8 is retained in the truss module 1 by passing a quick release pin 34 through one side of the extended shackle mount 8 then through the truss module 1 tubular assembly then through the opposite side of the extended shackle mount 8. The extended shackle mount 8 can be positioned toward the rear of the truss module 1 in order to cause the loudspeaker grouping to tilt downward or the extended shackle mount 8 can be positioned toward the front of the truss module 1 in order to cause the loudspeaker grouping to suspend vertically or tilt upward.

Referring now to FIGS. 22–24, representative of a six loudspeaker grouping of present invention comprises twelve truss modules 1 fastened to the loudspeakers with conventional mechanical means to the top and the bottom of each loudspeaker. Connecting bar devices 26 are inserted into the rear tubular assembly of the adjacent truss modules 1 at the top and the bottom of each loudspeaker, the bottom connecting bars 26 being held in place with quick release pins 34 at the selected inward-most position thereby positioning the loudspeakers close together at the bottom. The top connecting bars 26 being held in place with quick release pins 34 at the selected outward-most position thereby positioning the loudspeakers farther apart at the top and automatically tilting the loudspeaker downward. The connecting bar 26 is retained in the truss module 1 by passing a quick release pin 34 through one side of the truss module tubular assembly then through the inserted connecting bar then through the opposite side of the truss module tubular assembly. The universal joint mechanism built into the connecting bar 26 is adjusted to provide a splay (horizontal spreading) between the loudspeakers that will enable a circular loudspeaker grouping and then fastened securely by tightening the bolt fasteners located in the joint of the connecting bars 26. The loudspeakers, being in a fixed position, can then be suspended as a group utilizing three extended shackle mounts 8 fastened to the top truss modules 1 of each of the loudspeakers with the use of quick release pins 34. The extended shackle mounts 8 can be attached at any one of the selected holes included in the truss module 1 tubular assemblies. The extended shackle mount 8 is retained in the truss module 1 by passing a quick release pin 34 through one side of the extended shackle mount 8 then through the truss module 1 tubular assembly then through the opposite side of the extended shackle mount 8.

Referring now to FIGS. 25–27, representative of a nine loudspeaker multiple row grouping of present invention comprises eighteen truss modules 1 fastened to the loudspeakers with conventional mechanical means to the top and the bottom of each loudspeaker. Connecting bar devices 26 are inserted into the rear tubular assembly of the adjacent truss modules 1 at the top and the bottom of each loudspeaker. The top and bottom connecting bars 26 of the top and middle rows of grouped loudspeakers are held in place with quick release pins 34 at the selected inward-most position thereby positioning the loudspeakers close together at the top and at the bottom. The bottom connecting bars 26 of the bottom row of grouped loudspeakers are held in place with quick release pins 34 at the selected inward-most position thereby positioning the loudspeakers close together at the bottom. The top connecting bars 26 of the bottom row of grouped loudspeakers are being held in place with quick release pins 34 at the selected outward-most position thereby positioning the loudspeakers farther apart at the top. The connecting bar 26 is retained in the truss module 1 by passing a quick release pin 34 through one side of the truss module tubular assembly then through the inserted connecting bar then through the opposite side of the truss module tubular assembly. The universal joint mechanism built into the connecting bar 26 is adjusted to provide a splay (horizontal spreading) between the loudspeakers and is then fastened securely by tightening the bolt fasteners located in the joint of the connecting bars 26. The individual rows of loudspeaker groupings, being in a fixed position, can then be suspended as independent groups utilizing a combination of stacking brackets 22 and/or shackle mounts 15 and/or extended shackle mounts 8 fastened to the selected truss modules 1 of each of the loudspeakers with the use of quick release pins 34. The stacking brackets 22 and shackle mounts 15 and extended shackle mounts 8 can be attached at any one of the selected holes included in the truss module 1 tubular assemblies. The stacking bracket 22 and shackle mount 15 and extended shackle mount 8 is retained in the truss module 1 by passing a quick release pin 34 through one side of the stacking bracket 22 and/or shackle mount 15 and/or extended shackle mount 8 then through the truss module 1 tubular assembly then through the opposite side of the stacking bracket 22 and/or shackle mount 15 and/or extended shackle mount 8. The top row loudspeaker grouping is suspended with two shackle mounts 15 and the middle row loudspeaker grouping is attached to the top row with two stacking brackets 22 fastened to the truss modules 1 as described above. The top row loudspeaker grouping and the middle row loudspeaker grouping are fixed into a vertically stacked configuration with the use of the stacking brackets 22. The bottom row loudspeaker grouping is suspended from the middle row loudspeaker grouping utilizing four extended shackle mounts 8 fastened to the truss modules 1 as described above. Two extended shackle mounts 8 are attached to the bottom truss modules 1 of the middle row at the selected hole positions in the truss module 1 tubular assembly. Two extended shackle mounts 8 are attached to the top truss modules 1 of the bottom row loudspeaker grouping at the selected hole positions in the truss module 1 tubular assembly. By selecting the appropriate extended shackle mount 8 mounting hole in the truss modules 1 attached to the bottom of the middle row loudspeaker grouping, the bottom row loudspeaker grouping is moved back so that the fronts of the loudspeakers are in coherent alignment. By selecting the appropriate extended shackle mount 8 mounting hole in the truss modules 1 attached to the top of the bottom row grouping of loudspeakers, the bottom row downward tilt angle can be adjusted as desired. The connection between the extended shackle mounts 8 attached to the bottom of the middle row grouping of loudspeakers and the extended shackle mounts 8 attached to the top of the bottom row grouping of loudspeakers is achieved by commonplace mechanical means.

The present invention thus provides a modular loudspeaker enclosure suspension rigging system comprising structural members (truss modules) which, when attached to a loudspeaker enclosure, renders that loudspeaker enclosure suspendable. The same structural members (truss modules), when attached to numerous loudspeaker enclosures, render the group of loudspeaker enclosures suspendable as a whole unit from a minimized number of suspension points when various other members included in the present invention are utilized in conjunction with the truss modules. Moreover, the present invention allows for angle variance between adjacent loudspeaker enclosures by utilizing multiple adjustable structural components (connecting bars) between adjacent loudspeaker enclosures. The aforementioned connecting bars can be adjusted for proper loudspeaker enclosure aim and then tightened into a rigid connection between adjacent loudspeaker enclosures, thereby rendering the loudspeaker enclosure group a solid mass. The present invention allows for the suspension of the loudspeaker group by a minimal number of suspension points with the utilization of structural mounts (shackle mounts, extended shackle mounts, stacking brackets) connected onto the truss modules. The present invention provides for the expedient assembly and disassembly of all component parts with the use of structural retaining pins (quick release pins) and/or bolt and nut fasteners.

While the invention has been described with reference to its preferred configuration, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. A loudspeaker suspension system for suspending a plurality of individual loudspeakers from an overhead support for adjustment to different spaced apart relationships and orientations relative to one another, said system comprising:

a plurality of frame members to be mounted to the respective said loudspeakers and including respective elongated coupling elements; and a plurality of connectors for connection between respective adjacent pairs of said plurality of frame members when mounted on adjacent said loudspeakers, said connectors including respective pairs of elongated oppositely disposed connecting arms for coupling to the respective said coupling elements, at least one of each of said pairs of connecting arms being configured for coextensive longitudinal adjustment with respect to the respective said coupling elements and respective intermediate pivot joints for, when the respective said frame members are mounted on the respective said loudspeakers and the respective said coupling elements and the respective said connecting arms coupled together, pivoting said loudspeakers relative to one another; and a plurality of adjustment locks engageable between the respective said coupling elements and said at least one of each of said connecting arms to lock the respective said at least one of each said connecting arms relative to the respective said coupling elements to an adjustment position.

2. The loudspeaker suspension system of claim 1 wherein:

the respective said pivot joints include first and second orthogonal pivots to define a universal joint.

3. The loudspeaker suspension system of claim 1 wherein:

said plurality of connectors include respective adjustment bolts for tightening down on the respective said pivot joints to fix the respective said joints against pivoting.

4. The loudspeaker suspension system of claim 1 wherein:

said plurality of frame members include respective open ended tubes defining the respective said coupling elements for telescopical receipt therein of the respective said distal ends of said at least one of each of said connecting arms.

5. The loudspeaker suspension system of claim 4 wherein:

the respective said at least one of each of said connecting arms are rigid and include respective spaced apart locking bores and the respective said open ended tubes are rigid and include at least one pin bore configured for, when the respective said at least one of each of said connecting arms are telescoped into the respective said tubes, aligning a respective one of said pin bores with a respective one of said locking bores, and wherein;

the respective said adjustment locks comprise a plurality of releasable locking pins, for when the respective said ones of said pin bores are aligned with the respective said ones of said locking bores, said pin may be received within said respective one of said pin bores and within the respective said one of said locking bores.

6. The loudspeaker suspension system of claim 1 wherein:

both of the respective said pairs of connecting arms are configured for coextensive longitudinal adjustment with respect to the respective said coupling elements.

7. The loudspeaker suspension system of claim 1 wherein said plurality of frame members define a first pair of frame members to be mounted to the top of the respective said loudspeakers, said system further comprising:

a second plurality of frame members to be mounted to the bottom of the respective said loudspeakers and including respective bottom coupling elements; and a second plurality of connectors for connection between respective adjacent second plurality of frame members when mounted on adjacent said loudspeakers, said second connectors including respective oppositely disposed connector arms for, when the respective said second frame members are mounted on the bottom of the respective said loudspeakers and the connector arms and the bottom coupling elements are coupled together, pivoting said loudspeakers relative to one another.

8. A loudspeaker suspension system for suspending a plurality of individual loudspeakers from an overhead support for adjustment to different spaced apart relationships and orientations relative to one another, said system comprising:

a plurality of frame members to be mounted to the respective said loudspeakers and including respective coupling elements; and a plurality of connectors for connection between respective adjacent pairs of said plurality of frame members when mounted on adjacent said loudspeakers, said connectors including respective pairs of elongated oppositely disposed connecting arms for coupling on their respective distal ends with the respective said coupling elements, at least one of each of said pairs of connecting arms being configured for coextensive longitudinal adjustment with respect to the respective said coupling elements, and respective intermediate pivot joints for, when the respective said frame members are mounted on the respective said loudspeakers and the respective said connecting arms and coupling elements coupled together, pivoting said loudspeakers relative to one another; and a plurality of adjustment locks engageable between the respective said coupling elements and said at least one of each said connecting arms to lock the respective said at least one of each said connecting arms relative to the respective said coupling elements to an adjustment position.

9. The loudspeaker suspension system of claim 8 wherein:

the respective said pivot joints include first and second orthogonal pivots to define a universal joint.

10. The loudspeaker suspension system of claim 9 wherein:

said plurality of connectors include respective adjustment bolts for tightening down on the respective said pivot joints to fix the respective said joints against pivoting.

11. The loudspeaker suspension system of claim 8 wherein:

said plurality of frame members include respective open ended tubes defining the respective said coupling elements for telescopical receipt therein of the respective said distal ends of said at least one of each of said connecting arms.

12. The loudspeaker suspension system of claim 11 wherein:

the respective said connecting arms are rigid and include respective spaced apart locking bores and the respective said open ended tubes are rigid and include at least one pin bore configured for, when the respective said connecting arms are telescoped into the respective said tubes, aligning a respective one of said pin bores with a respective one of said locking bores, and wherein;

the respective said adjustment locks comprise a plurality of releasable locking pins, for when the respective said ones of said pin bores are aligned with the respective said ones of said locking bores, said pin may be received within said respective one of said pin bores and within the respective said one of said locking bores.

13. The loudspeaker suspension system of claim 8 wherein said plurality of frame members define a first pair of frame members to be mounted to the top of the respective said loudspeakers, said system further comprising:

a second plurality of frame members to be mounted to the bottom of the respective said loudspeakers and including respective bottom coupling elements; and a second plurality of connectors for connection between respective adjacent second plurality of frame members when mounted on adjacent said loudspeakers, said second connectors including respective oppositely disposed connector arms for, when the respective said second frame members are mounted on the bottom of the respective said loudspeakers and the connector arms and the bottom coupling elements are coupled together, pivoting said loudspeakers relative to one another.

14. The loudspeaker suspension system of claim 8 wherein:

both of the respective said pairs of connecting arms are configured for coextensive longitudinal adjustment with respect to the respective said coupling elements.

15. A connector for connecting between a pair of adjacent loudspeakers to adjustably connect said pairs of loudspeakers relative to one another to selectively align the acoustic wavefronts of said loudspeakers and said connector comprising:

a pair of elongated oppositely disposed coupling elements including respective connecting arms for coupling on their respective distal ends to the respective said loudspeakers, said connecting arms and coupling elements forming first and second pivot joints therebetween for rotating said respective connecting arms relative to said coupling elements about respective first and second axes;

a third pivot joint connecting the respective proximal ends of said coupling elements together in overlying pivotal relation for rotation of said elements relative to one another about a third axis orthogonal to said first and second axes.

16. The connector of claim 15 wherein:

the respective said first, second and third pivot joints define a universal joint.

17. The connector of claim 16 wherein:

said coupling elements include respective adjustment bolts for tightening down on the respective said first, second and third pivot joints to fix the respective said joints against pivoting.

* * * * *